US009460909B2

(12) United States Patent
Chang et al.

(10) Patent No.: US 9,460,909 B2
(45) Date of Patent: Oct. 4, 2016

(54) METHOD FOR MANUFACTURING SEMICONDUCTOR DEVICE

(71) Applicant: Taiwan Semiconductor Manufacturing Company, Ltd., Hsin-Chu (TW)

(72) Inventors: Ching-Yu Chang, Yuansun Village (TW); Chen-Yu Liu, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/017,157

(22) Filed: Feb. 5, 2016

(65) Prior Publication Data

US 2016/0155626 A1 Jun. 2, 2016

Related U.S. Application Data

(63) Continuation of application No. 14/490,517, filed on Sep. 18, 2014, now Pat. No. 9,256,128, which is a continuation-in-part of application No. 14/056,737, filed on Oct. 17, 2013, now Pat. No. 9,245,751.

(60) Provisional application No. 61/777,782, filed on Mar. 12, 2013, provisional application No. 61/985,945, filed on Apr. 29, 2014.

(51) Int. Cl.
*G03F 7/11* (2006.01)
*H01L 21/02* (2006.01)
(Continued)

(52) U.S. Cl.
CPC ......... *H01L 21/0206* (2013.01); *C08F 220/18* (2013.01); *C08F 220/22* (2013.01);
(Continued)

(58) Field of Classification Search
CPC ............. G03F 7/11; G03F 7/40; G03F 7/25; C08F 220/22; C08F 220/18; H01L 21/0276; H01L 21/02343; H01L 21/02359; H01L 21/31111; C11D 11/0047
USPC ......... 430/271.1, 273.1, 322, 329, 330, 331; 510/175, 176
See application file for complete search history.

(56) References Cited

U.S. PATENT DOCUMENTS 4,072,527 A  2/1978  Fan
4,212,935 A  7/1980  Canavello et al.
(Continued)

FOREIGN PATENT DOCUMENTS

EP    1500977 A1    1/2005
JP    2006145788 A   6/2006
(Continued)

OTHER PUBLICATIONS

Hamad, et al., "Fluorinated Dissolution Inhibitors for 157 nm Lithography," Proc. SPIE vol. 4690, Jul. 15, 2002, pp. 477-485.
(Continued)

*Primary Examiner* — Amanda C Walke
(74) *Attorney, Agent, or Firm* — Slater Matsil, LLP

(57) ABSTRACT

A system and method for anti-reflective layers is provided. In an embodiment the anti-reflective layer comprises a floating component in order to form a floating region along a top surface of the anti-reflective layer after the anti-reflective layer has dispersed. The floating component may be a floating cross-linking agent, a floating polymer resin, or a floating catalyst. The floating cross-linking agent, the floating polymer resin, or the floating catalyst may comprise a fluorine atom. The anti-reflective layers are removed using a fluid.

20 Claims, 7 Drawing Sheets

(51) Int. Cl.
*H01L 21/027* (2006.01)
*H01L 29/66* (2006.01)
*H01L 21/311* (2006.01)
*C08F 220/22* (2006.01)
*C08F 220/18* (2006.01)
*C11D 11/00* (2006.01)

(52) U.S. Cl.
CPC .............. *C11D11/0047* (2013.01); *G03F 7/11* (2013.01); *H01L 21/0276* (2013.01); *H01L 21/31111* (2013.01); *H01L 29/66795* (2013.01)

(56) References Cited

U.S. PATENT DOCUMENTS

| | | | |
|---|---|---|---|
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,613,493 B2 | 9/2003 | Lee et al. |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,991,888 B2 | 1/2006 | Padmanaban et al. |
| 7,192,910 B2 | 3/2007 | Wojtczak et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,354,890 B2 | 4/2008 | Hara et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,507,783 B2 | 3/2009 | Meador et al. |
| 7,541,134 B2 | 6/2009 | Iwabuchi et al. |
| 7,579,308 B2 | 8/2009 | Lee |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,700,533 B2 | 4/2010 | Egbe et al. |
| 7,709,370 B2 | 5/2010 | Allen et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,759,253 B2 | 7/2010 | Chang |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,879,782 B2 | 2/2011 | Wu et al. |
| 7,888,300 B2 | 2/2011 | Seki et al. |
| 7,919,222 B2 | 4/2011 | Vohra et al. |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,003,587 B2 | 8/2011 | Lee et al. |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,092,703 B2 | 1/2012 | Ishibashi et al. |
| 8,105,748 B2 | 1/2012 | Ohashi et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,512,939 B2 | 8/2013 | Wang et al. |
| 8,518,628 B2 | 8/2013 | Chang et al. |
| 8,546,062 B2 | 10/2013 | Huang et al. |
| 8,586,290 B2 | 11/2013 | Wang et al. |
| 8,617,417 B2 | 12/2013 | Inaba et al. |
| 8,753,797 B2 | 6/2014 | Lin et al. |
| 8,835,697 B2 | 9/2014 | Kori et al. |
| 8,841,058 B2 | 9/2014 | Chang |
| 8,889,334 B2 | 11/2014 | Kennedy et al. |
| 8,951,948 B2 | 2/2015 | Rath et al. |
| 2001/0044070 A1 | 11/2001 | Uetani et al. |
| 2002/0012875 A1 | 1/2002 | Pavelchek et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0172896 A1 | 11/2002 | Adams et al. |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0094613 A1 | 5/2006 | Lee |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0227025 A1 | 9/2008 | Kanda |
| 2008/0241778 A1 | 10/2008 | Kulp |
| 2009/0042147 A1 | 2/2009 | Tsubaki |
| 2009/0239176 A1 | 9/2009 | Kanda |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0239984 A1 | 9/2010 | Tsubaki |
| 2011/0020755 A1 | 1/2011 | Tsubaki |
| 2011/0033801 A1 | 2/2011 | Zampini et al. |

(56) References Cited

U.S. PATENT DOCUMENTS

| | | | |
|---|---|---|---|
| 2011/0076626 A1 | 3/2011 | Padmanaban et al. |
| 2011/0097670 A1 | 4/2011 | Wang et al. |
| 2011/0250543 A1 | 10/2011 | Tsubaki |
| 2011/0263136 A1 | 10/2011 | Kim et al. |
| 2011/0287634 A1 | 11/2011 | Barr et al. |
| 2012/0052687 A1 | 3/2012 | Raghavan et al. |
| 2012/0171616 A1 | 7/2012 | Thackeray et al. |
| 2012/0238106 A1 | 9/2012 | Chuang |
| 2012/0282553 A1 | 11/2012 | Kimura et al. |
| 2012/0308741 A1 | 12/2012 | Kim et al. |
| 2012/0308939 A1 | 12/2012 | Kudo et al. |
| 2013/0171569 A1 | 7/2013 | Tachibana et al. |
| 2014/0011133 A1 | 1/2014 | Liu et al. |
| 2014/0011359 A1 | 1/2014 | Klipp et al. |

FOREIGN PATENT DOCUMENTS

| | | | |
|---|---|---|---|
| KR | 20000023145 A | 4/2000 |
| KR | 20110127088 A | 11/2011 |
| TW | 513747 B | 12/2002 |
| TW | 550695 B | 9/2003 |
| TW | I336819 B | 2/2011 |
| TW | I341961 B | 5/2011 |
| TW | I343513 B | 6/2011 |
| WO | 2005088397 A2 | 9/2005 |
| WO | 2006054432 A1 | 5/2006 |

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

Kitano, Junichi et al., "Resist pattern collapse prevention for the sub-90nm node," Microlithography World, May 2004, pp. 18-24, PennWell Publishing Corp.

Kunz, Roderick R, Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, "Photoreactive Polymers: The Science and Technology of Resists," Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

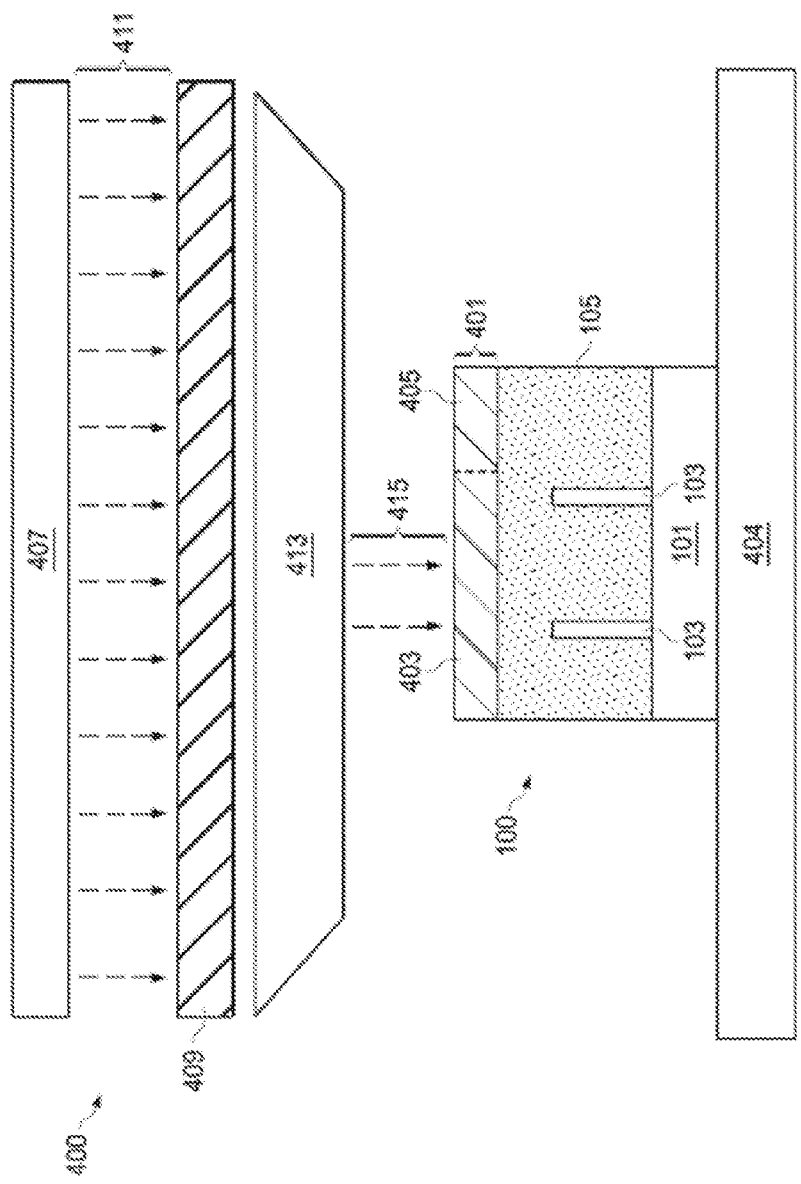

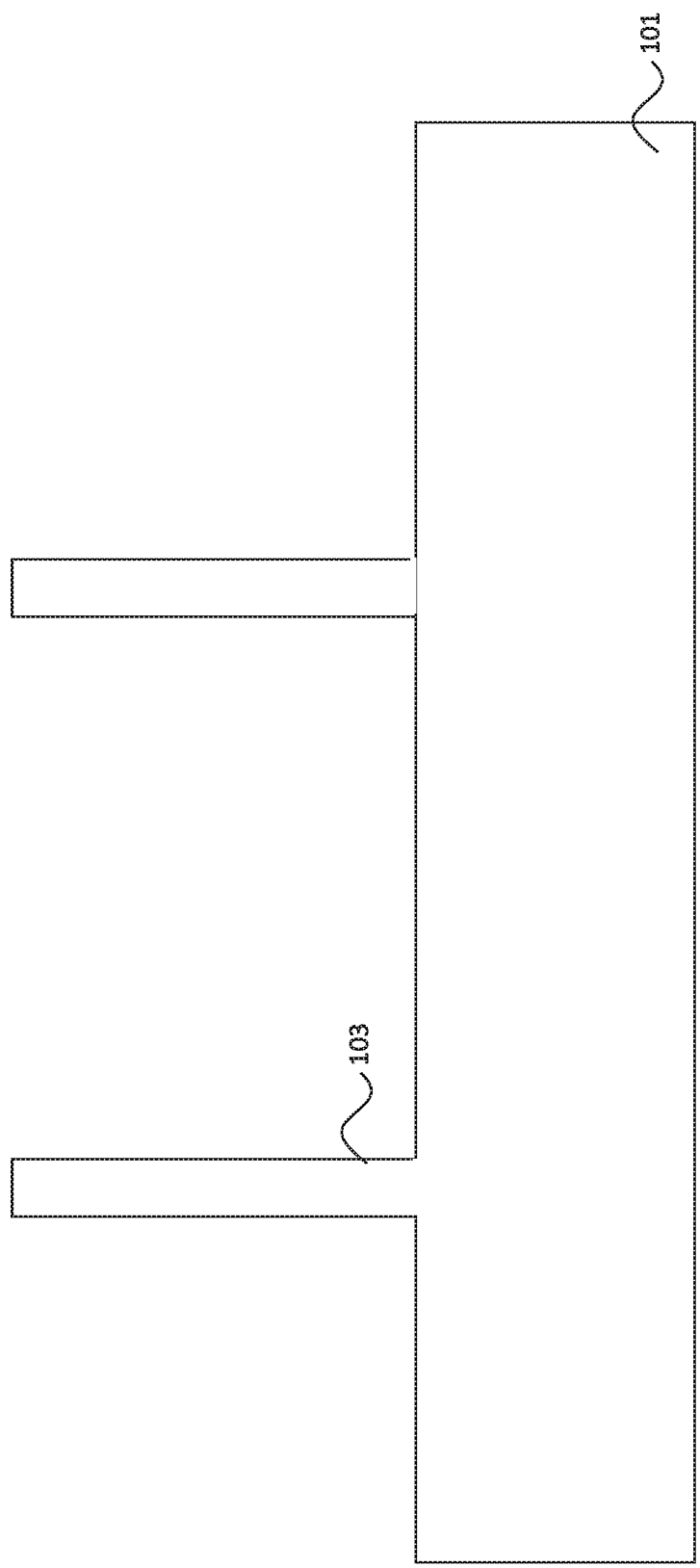

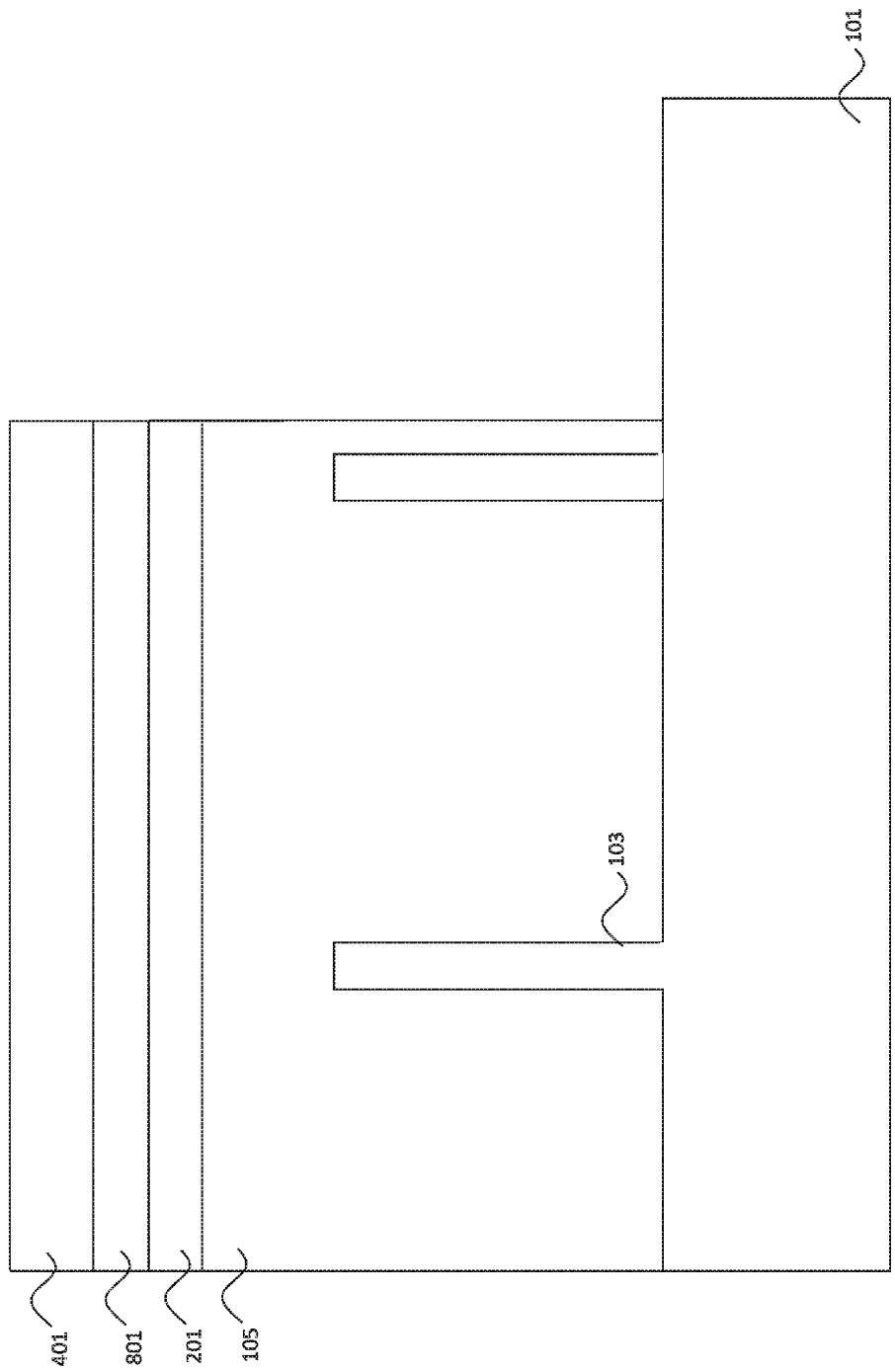

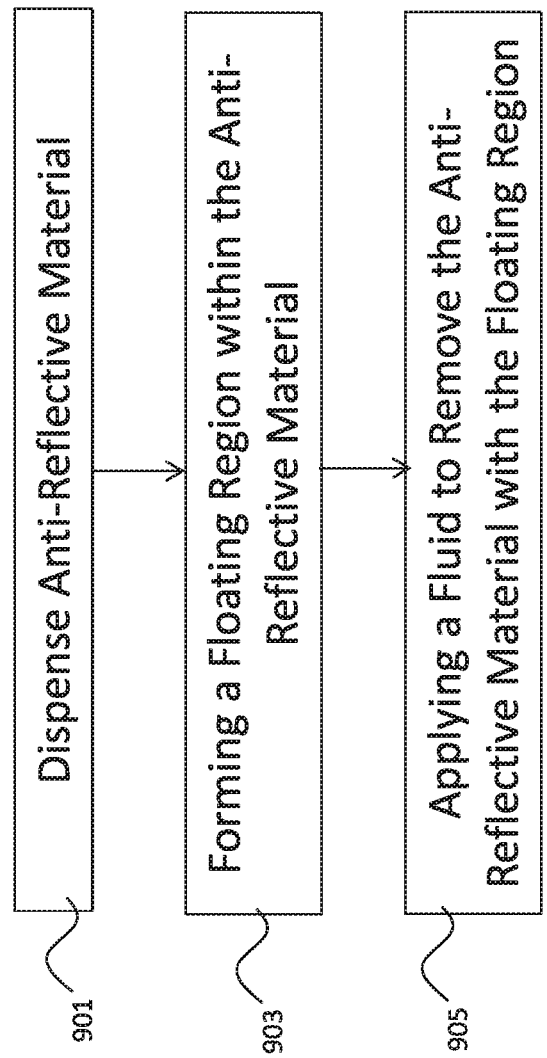

METHOD FOR MANUFACTURING SEMICONDUCTOR DEVICE

CROSS REFERENCE

This application is a continuation of U.S. patent application Ser. No. 14/490,517, filed on Sep. 18, 2014, entitled "Method for Manufacturing Semiconductor Device," which is a continuation-in-part of U.S. patent application Ser. No. 14/056,737, filed on Oct. 17, 2013, entitled "Anti-Reflective Layer and Method," now U.S. Pat. No. 9,245,751, issued on Jan. 26, 2016, claims the benefit of U.S. Provisional Application No. 61/777,782 filed on Mar. 12, 2013, entitled "Anti-Reflective Layer and Method," and also claims the benefit of U.S. Provisional Application No. 61/985,945 filed on Apr. 29, 2014, entitled "Anti-Reflective Layer and Method," which applications are hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing, such as the use of anti-reflective layers to prevent undesired reflections of impinging light, have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 4A-4B illustrate an application, exposure, and development of a photoresist in accordance with an embodiment;

FIG. 7 illustrates a removal of the bottom anti-reflective layer and the floating region in accordance with an embodiment;

FIG. 8 illustrates a middle layer used in conjunction with the bottom anti-reflective layer in accordance with an embodiment; and FIG. 9 illustrates a process flow of dispensing the bottom anti-reflective layer, forming the floating region, and applying a fluid to remove the bottom anti-reflective layer in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a bottom anti-reflective coating utilized in the manufacturing of semiconductor devices. Other embodiments may also be applied, however, to other coatings in different processes.

Figure 1:
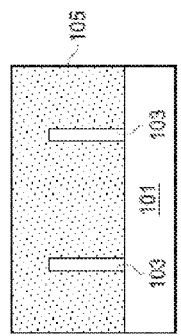
FIG. 1 illustrates an initial dispersion of a bottom anti-reflective layer on a semiconductor substrate in accordance with an embodiment.

With reference now to FIG. 1, there is shown a substrate 101 with fins 103 formed over the substrate 101 and a bottom anti-reflective coating (BARC) layer 105 applied over the fins 103 and the substrate 101. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The fins 103 will serve as a fin structure for the eventual formation of FinFET or multiple gate transistors (not separately illustrated in FIG. 1). In an embodiment the fins 103 may be formed from the material of the substrate 101 and, as such, may also comprise bulk silicon, doped or undoped, or be an active layer of a SOI substrate. The fins 103 may be formed by first applying a masking material over the substrate 101, patterning the masking material, and then using the masking material as a mask to etch into the substrate 101, thereby forming the fins 103 from the material of the substrate 101.

However, using the material of the substrate 101 to form the fins 103 is only one illustrative method that may be used to form the fins 103. Alternatively, the fins 103 may be formed by initially depositing a semiconductor material, such as silicon, silicon-germanium, or the like, over the substrate 101 and then masking and etching the semiconductor material to form the fins 103 over the substrate 101. In yet another alternative, the fins 103 may be formed by masking the substrate 101 and using, e.g., an epitaxial growth process to grow the fins 103 on the substrate 101. These, and any other suitable method for forming the fins 103 may alternatively be utilized, and all such methods are fully intended to be included within the scope of the embodiments.

The BARC layer 105 is applied over the fins 103 and fills the regions between the fins 103 in preparation for an application of a photoresist 401 (not illustrated in FIG. 1 but illustrated and described below with respect to FIG. 4A). The BARC layer 105, as its name suggests, works to prevent the uncontrolled and undesired reflection of energy (e.g., light) such as light back into the overlying photoresist 401 during an exposure of the photoresist 401, thereby preventing the reflecting light from causing reactions in an undesired region of the photoresist 401. Additionally, the BARC layer 105 may be used to provide a planar surface over the substrate 101 and the fins 103, helping to reduce the negative effects of the energy impinging at an angle.

The cross-linking monomer may be used to cross-link the monomer with other polymers within the polymer resin, to modify the solubility of the BARC layer 105, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl (meth)acrylate, ethyl(meth)acrylate, (meth)acrylic acid, poly(hydroxystyrene-styrene-methacrylate), poly(4-hydroxystyrene), and poly(pyromellitic dianhydride-ethylene glycol-propylene oxide).

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy) ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin modify the solubility of the BARC layer 105, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(metha)crylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl (meth)acrylate, ethyl(meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

The various monomers will be polymerized with one another to form a polymer structure with a carbon chain backbone for the polymer resin. In an embodiment the polymer structure may have a carbon chain backbone that is an acrylic, a polyester, an epoxy novalac, a polysaccharide, a polyether, a polyimide, a polyurethane, and mixtures thereof. One example of a particular polymer resin that may be utilized has the following structure:

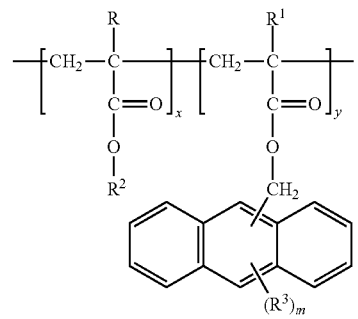

where each R and $R^1$ may be a hydrogen or a substituted or unsubstituted alkyl group having from 1 to 8 carbon atoms; each $R^2$ may be a substituted or unsubstituted alkyl having from 1 to 10 carbon atoms; and each $R^3$ may be a halogen atom, an alkyl having from 1 to 8 carbon atoms, an alkoxy having between 1 to 8 carbon atoms, an alkenyl having between 2 to 8 carbon atoms, an alkynyl having from 2 to 8 carbon atoms, cyano, nitro; m is an integer of from 0 to 9; and x is the mole fraction of percent of alkyl units in the polymer resin and is between about 10% and about 80%; and y is the mole fraction or percent of anthracene units in the polymer resin and is between about 5% and about 90%.

In another embodiment the polymer resin may also comprise a surface energy modification monomer (with, e.g., a surface energy modification group). The surface energy modification monomer is utilized to try and match the surface energy of the BARC layer 105 to the surface energy of the material of the substrate 101 and the fins 103 (e.g., silicon). By matching the surface energies, capillary forces may be used to enhance the gap filling performance of the BARC layer 105.

In one embodiment the surface energy modification monomer may be used to increase the surface energy of the BARC layer 105. In such an embodiment, to raise the surface energy of the BARC layer 105, the surface energy modification group within the surface energy modification monomer comprises one or more of a hydroxyl group, a carboxyl group, an amine group, or an amide group. In a particular embodiment the surface energy modification monomer may have a structure such as the following:

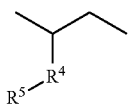

Wherein the $R^4$ and $R^5$ groups collectively form the surface energy modification group and where $R^4$ is an alkyl group with hydrogen attached to the hydrocarbons and wherein $R^4$ may have a straight, branched, or cyclic structure. The alkyl group within $R^4$ may also comprise hetero atoms, such as containing nitrogen or oxygen atoms. $R^5$ may contain at least one of a hydroxyl, carboxyl, amine, or amide group.

In particular embodiments, the surface energy modification monomer may comprise an acrylic acid monomer, a methacrylic acid monomer, a hydrostyrene monomer, or a monomer derived from 2-hydroxyethyl acrylate. For example, in an embodiment in which the surface energy modification group is a hydrostyrene monomer, the surface energy modification monomer may have the following structure:

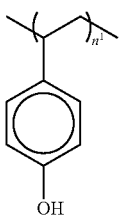

In an embodiment in which the surface energy modification monomer is an acrylic acid monomer, the surface energy modification monomer may have the following structure:

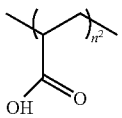

In an embodiment in which the surface energy modification group is a monomer derived from 2-hydroxyethyl acrylate, the surface energy modification monomer may have the following structure:

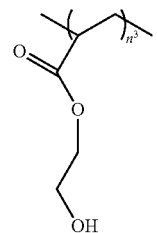

However, as one of ordinary skill in the art will recognize, the precise structures and examples described to raise the surface energy of the BARC layer 105 are intended to be illustrative and are not intended to be limiting. Rather, any suitable functional group within any suitable monomer that would raise the surface energy of the BARC layer 105 may alternatively be utilized. These are all fully intended to be included within the scope of the embodiments.

Alternatively, the surface energy modification monomer may be used to decrease the surface energy of the BARC layer 105. In such an embodiment, to decrease the surface energy of the BARC layer 105, the surface energy modification group within the surface energy modification monomer comprises one or more of an alkyl group, a fluoro group, a chloro group, or a benzyl group. In particular embodiments, the surface energy modification group may comprise a linear, branched, or cyclic alkyl or fluoro functional group.

In a particular embodiment the surface energy modification monomer may have a structure such as the following:

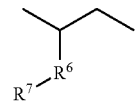

Wherein the $R^6$ and $R^7$ groups collectively form the surface energy modification group and where $R^6$ is an alkyl group with hydrogen attached to the hydrocarbons and wherein $R^6$ may have a straight, branched, or cyclic structure. The alkyl group within $R^6$ may also comprise hetero atoms, such as containing nitrogen or oxygen atoms. However, in this embodiment, $R^7$ may contain at least one of an alkyl, fluoro, or benzyl group, and may comprise a linear, branched, or cyclic alkyl or fluoro group. For example, in some embodiments the polymer resin with the surface energy modification monomer may have the following structures:

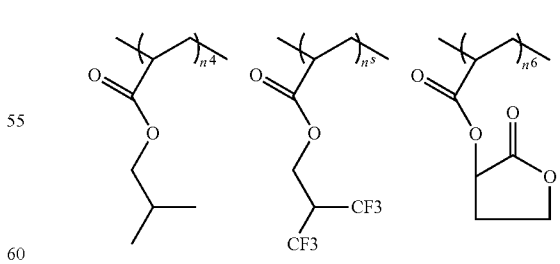

By utilizing the surface energy modification monomer, the surface energy of the polymer resin and, as such, the BARC layer 105 may be modified such that it more closely resembles the surface energy of the substrate 101 and the fins 103. By adjusting the surface energy, the BARC layer 105, instead of being repelled by the underlying material, will actually be pulled into small openings between structures by capillary forces. This helps the BARC layer 105 fill such gaps without voids.

Additionally, as one of ordinary skill in the art will recognize, the above description for the various monomers that may be polymerized to form the polymer resin for the BARC layer 105 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

In another embodiment one of the surface energy modification monomer, the cross-linking monomer, or the monomer with the chromophore unit may also comprise an inorganic component. In an embodiment the inorganic component may comprise a silicon atom and the surface energy modification group may be bonded to the silicon atom within the surface energy modification monomer. Alternatively, the chromophore group (within the monomer with the chromophore unit) may be bonded to the inorganic component within the chromophore monomer, or the cross-linking group may be bonded to the inorganic component within the cross-linking monomer. Any suitable combination of inorganic component within any of the surface energy modification monomer, the chromophore monomer, or the cross-linking monomer may be utilized.

By utilizing an inorganic material within the monomers, the surface energy of the BARC layer 105 may be modified. Additionally, if it is modified so that the surface energy of the BARC layer 105 is similar to the surface energy of the underlying material (e.g., the substrate 101 and fins 103), capillary forces may be used to pull the BARC layer 105 into small spaces between structures such as the fins 103. This will then help with filling the gaps and preventing defects that may arise from an inconsistent filling of the BARC layer 105.

In one embodiment the surface energy modification monomer with the energy modification group may be used to increase the surface energy of the BARC layer 105. In such an embodiment, to raise the surface energy of the BARC layer 105, the surface energy modification group comprises one or more of a hydroxyl group, a carboxyl group, an amine group, or an amide group. In a particular embodiment the surface energy modification monomer may have a structure such as the following:

Wherein $R^8$ and $R^9$ collectively make up the surface energy modification group and where $R^8$ is an alkyl group with hydrogen attached to the hydrocarbons and wherein $R^8$ may have a straight, branched, or cyclic structure. The alkyl group within $R^8$ may also comprise hetero atoms, such as containing nitrogen or oxygen atoms. $R^9$ may contain at least one of a hydroxyl, carboxyl, amine, or amide group.

In particular embodiments, the surface energy modification monomer may comprise an acrylic acid group, a methacrylic acid group, or a hydrostyrene group. In an embodiment in which the surface energy modification monomer comprises silicon and the surface energy modification group is hydrostyrene, the surface energy modification monomer may have the following structure:

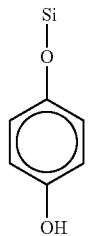

In an embodiment in which the surface energy modification monomer comprises silicon and the surface energy modification group is a hydroxyl group, the surface energy modification monomer may have the following structure:

In another embodiment the surface energy modification monomer comprises silicon and the surface energy modification group is a methacrylic acid group. In another embodiment the surface energy modification monomer comprises silicon and the surface energy modification group is an acrylic acid monomer.

However, as one of ordinary skill in the art will recognize, the precise structures and examples described to raise the surface energy of the BARC layer 105 are intended to be illustrative and are not intended to be limiting. Rather, any suitable functional group that would raise the surface energy of the BARC layer 105 may alternatively be utilized. These are all fully intended to be included within the scope of the embodiments.

Alternatively, the surface energy modification monomer with an inorganic component may be used to decrease the surface energy of the BARC layer 105. In such an embodiment, to decrease the surface energy of the BARC layer 105, the surface energy modification group in the surface energy modification monomer comprises one or more of an alkyl group, a fluoro group, or a benzyl group. In particular embodiments, the surface energy modification monomer may comprise a linear, branched, or cyclic alkyl or fluoro functional group.

In a particular embodiment the surface energy modification monomer may have a structure such as the following:

Wherein $R^{10}$ and $R^{11}$ collectively form the surface energy modification group and where $R^{10}$ is an alkyl group with hydrogen attached to the hydrocarbons and wherein $R^{10}$ may have a straight, branched, or cyclic structure. The alkyl group within $R^{10}$ may also comprise hetero atoms, such as containing nitrogen or oxygen atoms. However, in this embodiment, $R^{11}$ may contain at least one of an alkyl, fluoro, benzyl group, and may comprise a linear, branched, or cyclic alkyl or fluoro group. For example, in some embodiments the surface energy modification monomer may have one of the following structures:

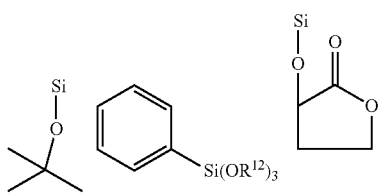

Wherein $R^{12}$ is an alkyl with from one to six carbon atoms.

Additionally in this embodiment, the inorganic element (e.g., silicon) is not limited to being only present on the polymer backbone. Rather, the inorganic element may be placed anywhere within the polymer resin. As one example, the cross-linking monomer may be formed with an inorganic functional group, such as silicon ethoxyl or silicon methoxyl, although any other suitable cross-linking material may also be utilized.

The catalyst may be a compound that is used to initiate a cross-linking reaction between the polymers within the polymer resin, and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the BARC layer 105. Specific examples of the thermal acid generator include butane sulfonic acid, triflic acid nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitrosubstituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

In an embodiment the floating cross-linking agent is also included with the polymer resin and the catalyst. The floating cross-linking agent will react with the polymers within the polymer resin and form linear or branched polymers structure that have larger molecular weight molecules, thereby improving the cross-linking density. In an embodiment the floating cross-linking agent may be an aliphatic polyether such as a polyether polyol, a polyglycidy ether, a vinyl ether, a glycouril, a triazene, combinations of these, or the like.

In an embodiment in which the floating cross-linking agent is a polyether polyol, the floating cross-linking agent has the following structure:

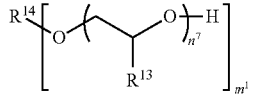

where $n^7$ represents an integer of 1 to 300; $m^1$ represents an integer of 2 to 6; $R^{13}$ represents a hydrogen atom or an alkyl group having 1 to 10 carbons atom(s); and $R^{14}$ represents an alkyl group having 1 to 10 carbon atom(s), an alkenyl group having 2 to 6 carbon atoms, an alkynyl group having 2 to 10 carbon atoms, alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof and is an organic group capable of having a valence number of 2 to 6 according to the number $m^1$ of polyoxyalkylene groups. Specific examples of alkyl groups that may be used for $R^{13}$ include methyl group, an ethyl group, a propyl group, an isopropyl group, an n-butyl group and an n-pentyl group.

Specific examples of an alkyl group that may be used for $R^{14}$ include methyl group, an ethyl group, an n-propyl group, an isopropyl group, a cyclopropyl group, an n-butyl group, an isobutyl group, an s-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1,4-dimethyl-cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Specific examples of the alkenyl group that may be used for $R^{14}$ include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl-etenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butyl-etenyl group, a 1,3-dimethyl-1-butenyl group, a 1,3-dimethyl-2-butenyl group, a 1,3-dimethyl-3-butenyl group, a 1-isobutyl-etenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl-etenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopoentyl group, a 1-cyclohexenyl group, a 2-cyclohexenyl group and a 3-cyclohexenyl group Specific examples of the alkynyl group that may be used for $R^{14}$ include an ethynyl group, a 1-propynyl group, a 2-propynyl group, a 1-butynyl group, a 2-butynyl group, a 3-butynyl group, a 1-methyl-2-propynyl group, a 1-pentynyl group, a 2-pentynyl group, a 3-pentynyl group, a 4-pentynyl group, a 1-methyl-2-butynyl group, a 1-methyl-3-butynyl group, a 2-methyl-3-butynyl group, a 3-methyl-1-butynyl group, a 1,1-dimethyl-2-propynyl group, a 2-ethyl-2-propynyl group, a 1-hexynyl, a 2-hexynyl group, a 3-hexynyl group, a 4-hexynyl group, a 5-hexynyl group, a 1-methyl-2-pentynyl group, a 1-methyl-3-pentynyl group, a 1-methyl-4-pentynyl group, a 2-methyl-3-pentynyl group, a 2-methyl-4-pentynyl group, a 3-methyl-1-pentynyl group, a 3-methyl-4-pentynyl group, a 4-methyl-1-pentynyl group, a 4-methyl-2-pentynyl group, a 1,1-dimethyl-2-butynyl group, a 1,1-dimethyl-3-butynyl group, a 1,2-dimethyl-3-butynyl group, a 2,2-dimethyl-3-butynyl group, a 3,3-dimethyl-1-butynyl group, a 1-ethyl-2-butynyl group, a 1-ethyl-3-butynyl group, a 1-n-propyl-2-propynyl group, a 2-ethyl-3-butynyl group, a 1-methyl-1-ethyl-2-propynyl group and a 1-isopropyl-2-propynyl group.

Specific examples of the alkylcarbonyl group that may be used for $R^{14}$ include a methylcarbonyl group, an ethylcarbonyl group, an n-propylcarbonyl group, an isopropylcarbonyl group, a cyclopropylcarbonyl group, an n-butylcarbonyl group, an isobutylcarbonyl group, an s-butylcarbonyl group, a tert-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butyl carbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2-methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group and a 2-ethyl-3-methyl-cyclopropylcarbonyl group.

Specific examples of the alkylcarbonylamino group that may be used for $R^{14}$ a methylcarbonylamino group, an ethylcarbonylamino group, an n-propylcarbonylamino group, an isopropylcarbonylamino group, a cyclopropylcarbonylamino group, an n-butylcarbonylamino group, an isobutylcarbonylamino group, an s-butylcarbonylamino group, a tert-butylcarbonylamino group, a cyclobutylcarbonylamino group, a 1-methyl-cyclopropylcarbonylamino group, a 2-methyl-cyclopropylcarbonylamino group, an n-pentylcarbonylamino group, a 1-methyl-n-butylcarbonylamino group, a 2-methyl-n-butylcarbonylamino group, a 3-methyl-n-butylcarbonylamino group, a 1,1-dimethyl-n-propylcarbonylamino group, a 1,2-dimethyl-n-propylcarbonylamino group, a 2,2-dimethyl-n-propylcarbonylamino group, a 1-ethyl-n-propylcarbonylamino group, a cyclopentylcarbonylamino group, a 1-methyl-cyclobutylcarbonylamino group, a 2-methyl-cyclobutylcarbonylamino group, a 3-methyl-cyclobutylcarbonylamino group, a 1,2-dimethyl-cyclopropylcarbonylamino group, a 2,3-dimethyl-cyclopropylcarbonylamino group, a 1-ethyl-cyclopropylcarbonylamino group, a 2-ethyl-cyclopropylcarbonylamino group, an n-hexylcarbonylamino group, a 1-methyl-n-pentylcarbonylamino group, a 2-methyl-n-pentylcarbonylamino group, a 3-methyl-n-pentylcarbonylamino group, a 4-methyl-n-pentylcarbonylamino group, a 1,1-dimethyl-n-butylcarbonylamino group, a 1,2-dimethyl-n-butylcarbonylamino group, a 1,3-dimethyl-n-butylcarbonylamino group, a 2,2-dimethyl-n-butylcarbonylamino group, a 2,3-dimethyl-n-butylcarbonylamino group, a 3,3-dimethyl-n-butylcarbonylamino group, a 1-ethyl-n-butylcarbonylamino group, a 2-ethyl-n-butylcarbonylamino group, a 1,1,2-trimethyl-n-propylcarbonylamino group, a 1,2,2-trimethyl-n-propylcarbonylamino group, a 1-ethyl-1-methyl-n-propylcarbonylamino group, a 1-ethyl-2-methyl-n-propylcarbonylamino group, a cyclohexylcarbonylamino group, a 1-methyl-cyclopentylcarbonylamino group, a 2-methyl-cyclopentylcarbonylamino group, a 3-methyl-cyclopentylcarbonylamino group, a 1-ethyl-cyclobutylcarbonylamino group, a 2-ethyl-cyclobutylcarbonylamino group, a 3-ethyl-cyclobutylcarbonylamino group, a 1,2-dimethyl-cyclobutylcarbonylamino group, a 1,3-dimethyl-cyclobutylcarbonylamino group, a 2,2-dimethyl-cyclobutylcarbonylamino group, a 2,3-dimethyl-cyclobutylcarbonylamino group, a 2,4-dimethyl-cyclobutylcarbonylamino group, a 3,3-dimethyl-cyclobutylcarbonylamino group, a 1-n-propyl-cyclopropylcarbonylamino group, a 2-n-propyl-cyclopropylcarbonylamino group, a 1-isopropyl-cyclopropylcarbonylamino group, a 2-isopropyl-cyclopropylcarbonylamino group, a 1,2,2-trimethyl-cyclopropylcarbonylamino group, a 1,2,3-trimethyl-cyclopropylcarbonylamino group, a 2,2,3-trimethyl-cyclopropylcarbonylamino group, a 1-ethyl-2-methyl-cyclopropylcarbonylamino group, a 2-ethyl-1-methyl-cyclopropylcarbonylamino group, a 2-ethyl-2-methyl-cyclopropylcarbonylamino group and a 2-ethyl-3-methyl-cyclopropylcarbonylamino group.

Specific examples of the alkyloxyalkyl group that may be used for $R^{14}$ include a methyloxymethyl group, an ethyloxyethyl group, an ethyloxymethyl group, a propyloxypropyl group, a propyloxymethyl group, and a tert-butyloxy-tert-butyl group.

Specific examples of the alkylamino groups that may be used for $R^{14}$ include a methylamino group, an ethylamino group, an n-propylamino group, an isopropylamino group, a cyclopropylamino group, an n-butylamino group, an isobutylamino group, an s-butylamino group, a tert-butylamino group, a cyclobutylamino group, a 1-methyl-cyclopropylamino group, a 2-methyl-cyclopropylamino group, an n-pentylamino group, a 1-methyl-n-butylamino group, a 2-methyl-n-butylamino group, a 3-methyl-n-butylamino group and a 1,1-dimethyl-n-propylamino group.

Specific examples of the alkyldiamino groups that may be used for $R^{14}$ include a methyldiamino group, an ethyldiamino group, an n-propyldiamino group, an isopropyldiamino group, a cyclopropyldiamino group, an n-butyldiamino group, an isobutyldiamino group, an s-butyldiamino group, a tert-butyldiamino group, a cyclobutyldiamino group, a 1-methyl-cyclopropyldiamino group, a 2-methyl-cyclopropyldiamino group, an n-pentyldiamino group, a 1-methyl-n-butyldiamino group, a 2-methyl-n-butyldiamino group, a 3-methyl-n-butyldiamino group and a 1,1-dimethyl-n-propyldiamino group.

In an embodiment in which the floating cross-linking agent is a polyglycidil ether, the floating cross-linking agent has the following structure:

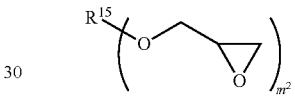

where $m^2$ represented an integer of 2 to 6 and $R^{15}$ represents (similar to the groups described above with respect to the polyether polyol) an alkyl group having 1 to 10 carbon atom(s), an alkenyl group having 2 to 6 carbon atoms, an alkynyl group having 2 to 10 carbon atoms, alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof; has either a straight, branched, or cyclic structure; and is an organic group capable of having a valence number of 2 to 6 according to the number $m^2$ of glycidyl ether groups.

In an embodiment in which the floating cross-linking agent is a vinyl ether, the floating cross-linking agent has the following structure:

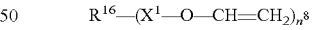

where $n^8$ is from one to six; $R^{16}$ is an aryl group or an alkyl group; and $X^1$ is an alkyl, alkoxys, carboxys, or combinations thereof.

In particular embodiments in which the floating cross-linking agent is a vinyl ether, the floating cross-linking agent has one of the following structures:

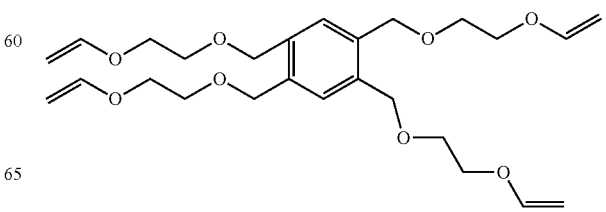

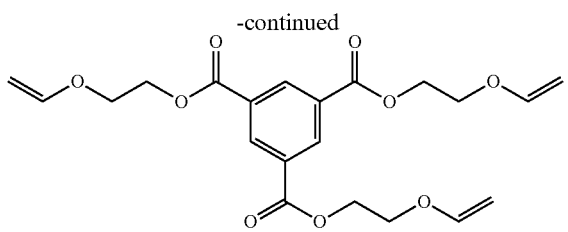

In an embodiment in which the floating cross-linking agent is a glycouril, the floating cross-linking agent may be a methylated glycouril such as a methoxy methylated glycouril. In a particular embodiment in which the floating cross-linking agent is a methoxy methylated glycouril the floating cross-linking agent has the following structure:

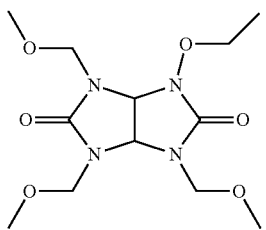

In an embodiment in which the floating cross-linker is a triazene, the floating cross-linker may be such triazenes as 3,3-dimethyl-1-phenylenetriaze, an aryl group containing 3,3-dimethyl-1-phylenetriazene, or bis(triazene). In a particular embodiment, the floating cross-linking agent that is a triazene with the following structure:

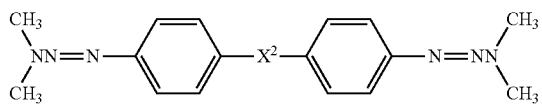

In an embodiment the floating cross-linking agent also comprises a substituted fluorine atom that has been incorporated into the structure of the floating cross-linking agent. In a particular embodiment the fluorine atom may be incorporated into the cross-linking structure as one or more fluorine atoms substituted for, e.g., a hydrogen atom within an alkyl group located within the structure of the floating cross-linking agent.

Alternatively, the fluorine atom may be part of an alkyl fluoride group that is substituted into the structure of the floating cross-linking agent. As particular examples, the fluorine atom may be incorporated into an alkyl fluoride group that has one of the following structures:

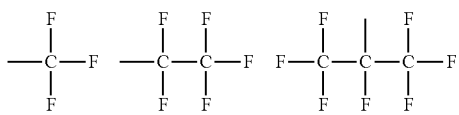

However, any suitable number of carbon and fluorine atoms may alternatively be utilized.

Additionally, as one of ordinary skill in the art will recognize, the precise examples listed above regarding the structures and groups that may be used within the floating cross-linking agent are merely intended to be illustrative and are not intended to list every possible structure or groups that may be utilized to form the floating cross-linking agent. Any suitable alternative structures and any suitable alternative groups may be utilized to form the floating cross-linking agent. All such structures and groups are fully intended to be included within the scope of the embodiments.

The individual components of the BARC layer 105 may be placed into the BARC solvent in order to aid in the mixing and placement of the BARC layer 105. To aid in the mixing and placement of the BARC layer 105, the solvent is chosen at least in part based upon the materials and monomers chosen for the polymer resin of the BARC layer 105 as well as the catalyst. In particular, the BARC solvent is chosen such that the polymer resin, the catalysts, and the floating cross-linking agent can be evenly dissolved into the BARC solvent and dispensed upon the substrate 101 and the fins 103.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 105 are merely illustrative and are not intended to limit the embodiments. Rather, any suitable material that may dissolve the polymer resin, the catalyst, and the floating cross-linking layer may alternatively be utilized to help mix and apply the BARC layer 105. All such materials are fully intended to be included within the scope of the embodiments.

Additionally, other components may also be added into the material for the BARC layer 105 if desired. For example, in an embodiment the monomeric dyes, surface leveling agents, adhesion promoters, anti-foaming agent, and the like, may alternatively be utilized. Any suitable additive may be added into the material for the BARC layer 105, and all such additives are fully intended to be included within the scope of the embodiments.

In an embodiment the polymer resin, the catalysts, and the floating cross-linking agent, along with any desired additives or other agents, are added to the BARC solvent to form the material for the BARC layer 105. Once added, the mixture is then mixed in order to achieve an even and constant composition throughout the material for the BARC layer 105 in order to ensure that there are no defects caused by an uneven mixing or non-constant composition of the material for the BARC layer 105. Once mixed together, the material for the BARC layer 105 may either be stored prior to its usage or else used immediately.

In its original mixed form, the material for the BARC layer 105 may comprise a constant composition of components, with the polymer resin having a concentration of between about 0.1% and about 60%, the catalyst having a concentration of between about 0.01% and about 10%, and the floating cross-linking agent having a concentration of between about 0.01% and about 30%. However, while these concentrations are illustrative, any suitable combinations of the various components of the material for the BARC layer 105 may be used, and all such combinations are fully intended to be included within the scope of the embodiments.

Once the material for the BARC layer 105 has been prepared, the material for the BARC layer 105 may be utilized by initially applying the material for the BARC layer 105 onto the substrate 101 and the fins 103. The material for the BARC layer 105 may be applied to the substrate 101 and the fins 103 so that the material for the BARC layer 105 coats an upper exposed surface of the substrate 101 and the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 105 may be initially applied such that it has a constant concentration and has a thickness over a top of the fins 103 of between about 10 nm and about 1000 nm, such as about 100 nm.

Figure 2:
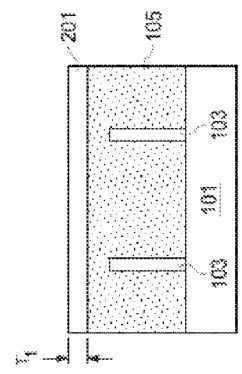
FIG. 2 illustrates a formation of a floating region in accordance with an embodiment.

FIG. 2 illustrates the floating cross-linker forming a floating region 201 along a top surface of the BARC layer 105. In an embodiment the floating cross-linker will move to the top of the BARC layer 105 as the BARC layer 105 is being applied, e.g., in the spin-on process. This movement is initiated because the addition of the fluorine atom causes the floating cross-linker to have a high surface energy. This high surface energy, coupled with the low interaction between the fluorine atoms and the other atoms within the BARC layer 105, will initiate the movement of the floating cross-linker to the top surface of the BARC layer 105.

In an embodiment with the formation of the floating region 201, the floating region 201 will have a higher concentration of the floating cross-linker than a remainder of the BARC layer 105, such as by having a concentration of between about 0.01% and about 10%, such as about 2%, while the remainder of the BARC layer 105 (outside of the floating region 201) will have a concentration of the floating cross-linker no greater than about 5%. Additionally, the floating region 201 will have a thickness $T_1$ of less than about 50% of the overall thickness of the BARC layer 105, such as between about 10 Å and about 1000 Å, such as about 100 Å. However, these dimensions and concentrations may vary and are intended to be illustrative only, and any benefits may be derived from suitable concentrations different from those listed herein.

Figure 3:
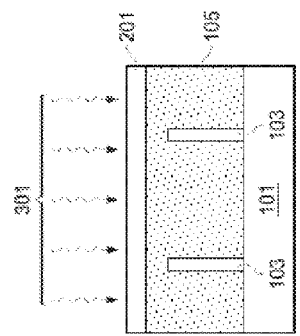
FIG. 3 illustrates a baking process in accordance with an embodiment.

FIG. 3 illustrates a pre-bake of the BARC layer 105 (represented in FIG. 3 by the wavy lines labeled 301), including both the bake itself and its resulting consequences. In an embodiment once the BARC layer 105 has been applied to the substrate 101 and the fins 103, the pre-bake 301 of the BARC layer 105 is performed in order to cure and dry the BARC layer 105 prior to an application of the photoresist 401. The curing and drying of the BARC layer 105 removes a portion of the BARC solvent components but leaves behind the polymer resin, the catalysts, the cross-linking agent, and other additives. In an embodiment the pre-bake 301 may be performed at a temperature suitable to evaporate the BARC solvent, such as between about 40° C. and 400° C. (such as between about 100° C. and 150° C.), although the precise temperature depends upon the materials chosen for the BARC layer 105. The pre-bake 301 is performed for a time sufficient to cure and dry the BARC layer 105, such as between about 10 seconds to about 5 minutes, such as about 90 seconds. Additionally, the pre-bake will cause the floating cross-linking agent to react with the polymer resin and begin bonding and cross-linking the individual polymers of the polymer resin into larger molecule polymers.

However, as one of ordinary skill in the art will recognize, the curing process described above (in which a thermal bake is performed to cure the BARC layer 105), is merely one illustrative process that may be used to cure the BARC layer 105 and initiate the cross-linking reactions, and is not intended to limit the embodiments. Rather, any suitable curing process, such as exposing the BARC layer 105 to an energy source (e.g., a photolithography exposure with a wavelength between about 10 nm to about 1000 nm), irradiating the BARC layer 105 to cure the BARC layer 105, or even an electrical cure of the BARC layer 105, or the like, may alternatively be utilized. All such curing processes are fully intended to be included within the scope of the embodiments.

When all of the components of the material of the BARC layer 105 have a constant concentration throughout the BARC layer 105, series issues in filling the gap between the fins 103 can occur during the pre-bake 301 in which solvent evaporates and cross-linking occurs. In particular, because the solvent evaporates at the surface of the BARC layer 105, the concentrations of the remaining components will increase, driving the cross-linking reaction to occur faster than within the remainder of the BARC layer 105, such as between the fins 103. As such, voids within the BARC layer 105 may be formed from this uneven reaction between the top of the BARC layer 105 and the remainder of the BARC layer 105.

In addition, the cross-linking reaction itself may cause voids to form. In particular, the cross-linking reaction will produce a number of reaction by-products while the polymers of the polymer resin are bonding to each other. These reaction by-products may vaporize and outgas during the pre-bake 301, causing voids to occur between cross-linked polymers throughout the BARC layer 105.

The cross-linking of the polymers, once mature, will also cause shrinkage to occur. In particular, as the polymers cross-link with each other, the cross-linking density of the BARC layer 105 will go up, resulting in a lower overall volume for the BARC layer 105. This lower volume will generate stresses along the surfaces to which the BARC layer 105 is coated (e.g., the substrate 101 and the fins 103). These stresses can pull the BARC layer 105 away from surface structures and causing voids to form adjacent to the surfaces such as the fins 103.

Additionally, the cross-linking reaction will also change the polymer resins to be more hydrophobic. This change will reduce the adhesion between the BARC layer 105 and the substrate 101. Such a reduction is adhesion, if a large enough reduction, can cause delamination and peeling to occur between the BARC layer 105 and the substrate 101, which can detrimentally affect the performance of the BARC layer 105 during further processing.

Finally, the while all of the above is occurring to form voids and peeling within the BARC layer 105, the combination of the cross-linking reaction and the removal of the solvent will also serve to harden and solidify the materials within the BARC layer 105. This hardening will prevent the materials from flowing into the voids or the peeling, preventing the materials of the BARC layer 105 from correcting the voids and peeling.

However, with the inclusion of the floating cross-linking agent and the formation of the floating region 201, the floating cross-linking agent will be located along the top surface of the BARC layer 105. As such, the cross-linking reaction will occur primarily within the floating region 201 with the remainder of the BARC layer 105 that is not located within the floating region 201 having fewer cross-linking reactions and, thus, fewer polymers cross-linking.

Given this, the cross-linking reaction will occur primarily across the top surface of the BARC layer 105, thereby providing the desired protection against the photoresist 401 which will be subsequently applied as well as providing the desired anti-reflective properties. However, the cross-linking reaction elsewhere within the BARC layer 105 will be reduced, leading to a reduction in all of the subsequent problems caused by excessive cross-linking. In particular, there will be no significant film shrinkage outside of the floating region 201 and there will be no significant cross-linking reaction by-products to outgas outside of the floating region 201, thereby avoiding the formation of voids. Additionally, by avoiding the cross-linking reaction along the interface of the BARC layer 105 and the substrate 101, the hydrophilicity of the BARC layer 105 will remain unchanged, leaving the adhesion the same and avoiding or reducing adhesion problems between the BARC layer 105 and the substrate 101. Finally, as the remainder of the BARC layer 105 has fewer cross-linked polymers, the BARC layer 105 may still be able to flow during the course of the cross-linking reactions, thereby filling some voids that may have formed at an early stage of the cross-linking reaction before the pre-bake 301 has been completed.

However, using the floating cross-linking agent is not the only method or material that may be used to form the floating region 201. Rather, any suitable material that is involved within the cross-linking reaction and which may be induced to float to the top surface of the BARC layer 105 and form the floating region 201 may alternatively be used. All such materials and methods are fully intended to be included within the scope of the embodiments.

For example, instead of using a floating cross-linking agent, in one alternative embodiment a floating polymer resin may be utilized instead of the floating cross-linking agent. In this embodiment the floating polymer resin may comprise a polymer resin as described above with respect to FIG. 1, but in which a fluorine atom has been substituted into the structure. For example, in an embodiment in which the floating polymer resin comprises an alkyl group, the fluorine atom may be substituted for a hydrogen atom within one or more of the alkyl groups of the polymer.

In another embodiment the fluorine atom may be part of a fluoralkyl group that is substituted into the polymer of the polymer resin. As a particular example, the fluorine atom may be incorporated into a fluoroalkyl groups such as the fluoroalkyl groups discussed above with respect to the floating cross-linking agent (e.g., $CF_3$, $C_2F_5$, $C_3F_7$, etc.). In an embodiment in which the polymer resin comprises an alkyl group, the fluoralkyl group may be substituted into the polymer resin to form the floating polymer resin by replacing one of the alkyl groups with the fluoroalkyl group to form the floating polymer resin.

In this embodiment, instead of the floating cross-linking agent described above with respect to FIG. 1, the cross-linking agent may be similar to the cross-linking agent described above for the floating cross-linking agent (without the addition of the fluorine atom). Alternatively, the cross-linking agent may be a melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bis-methoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In this embodiment in which the floating polymer resin is utilized instead of the floating cross-linking agent, the floating polymer resin may have an initial concentration within the material for the BARC layer 105 of between about 0.1% and about 60%, while the cross-linking agent may have an initial concentration of between about 0.01% and about 30%. The material for the BARC layer 105 may be dispersed as described above with respect to FIG. 1 (e.g., a spin-on process) so that the BARC layer 105 initially has a constant concentration when it is dispersed.

However, similar to the embodiment described above with respect to FIG. 2, once dispersed, the floating polymer resin, with the addition of the fluorine atom, will rise to the top of the BARC layer 105, forming the floating region 201 (see FIG. 2), during the dispensing process. With the floating region 201 at the top of the BARC layer 105, the pre-bake process will initiate the cross-linking reaction primarily in the floating region 201 and any cross-linking reactions outside of the floating region 201 will be reduced. By performing the cross-linking reaction adjacent to the top surface of the BARC layer 105, defects caused by voids and delimanation may be reduced or eliminated.

In yet another embodiment, instead of using the floating cross-linking agent or the floating polymer, the floating region 201 may be formed by using a floating catalyst. In this embodiment the floating catalyst may comprise trifluoride catalyst as described above with respect to FIG. 1, but in which a fluorine atom has been substituted into the structure. For example, in an embodiment in which the floating catalyst comprises an alkyl group, the fluorine atom may be substituted for a hydrogen atom within one or more of the alkyl groups of the catalyst.

In another embodiment the fluorine atom may be part of a fluoralkyl group that is substituted into the catalyst. As a particular example, the fluorine atom may be incorporated into a fluoroalkyl groups such as the fluoroalkyl groups discussed above with respect to the floating cross-linking agent (e.g., $CF_3$, $C_2F_5$, $C_3F_7$, etc.). In an embodiment in which the catalyst comprises an alkyl group, the fluoralkyl group may be substituted into the catalyst to form the floating catalyst by replacing one of the alkyl groups with the fluoroalkyl group to form the floating catalyst.

In specific embodiments, the fluorine atom or fluoroalkyl groups may be substituted into catalysts such as the following:

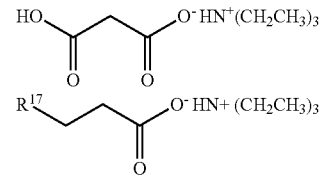

In this embodiment in which the floating catalyst is utilized instead of the floating cross-linking agent or the floating polymer resin, the floating catalyst may have an initial concentration within the material for the BARC layer 105 of between about 0.01% and about 10%. The material for the BARC layer 105 may be dispersed as described above with respect to FIG. 1 (e.g., a spin-on process) so that the material of the BARC layer 105 initially has a constant concentration when it is dispersed.

However, similar to the embodiment described above with respect to FIG. 2, once dispersed, the floating catalyst, with the addition of the fluorine atom, will rise to the top of the BARC layer 105, forming the floating region 201 (see FIG. 2), during the dispensing process. With the floating region 201 at the top of the BARC layer 105, the pre-bake process will initiate the cross-linking reaction only in the floating region 201 and any cross-linking reactions outside of the floating region 201 will be reduced or eliminated, thereby eliminating or reducing voids or delaminating problems.

Figure 4B:
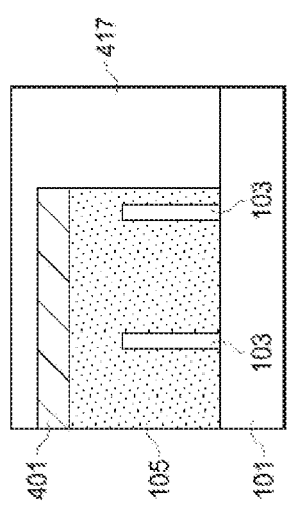

FIGS. 4A-4B illustrates an application, exposure, and development of a photoresist 401 over the BARC layer 105. In an embodiment the photoresist 401 includes a photoresist polymer resin along with one or more photoactive compounds (PACs) in a photoresist solvent. In an embodiment the photoresist polymer resin may comprise a hydrocarbon structure (such as a alicyclic hydrocarbon structure) that contains one or more groups that will decompose (e.g., an acid labile group) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is an photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 401 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 401 to underlying structures (e.g., the BARC layer 105). In an embodiment polar groups may be used to help increase the adhesiveness, and polar groups that may be used in this embodiment include hydroxyl groups, cyano groups, or the like, although any suitable polar group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl(meth)acrylate, cyclohexayl(meth)acrylate, combinations of these, or the like.

Additionally, the photoresist 401 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzo-phenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 401 may be placed into a photoresist solvent in order to aid in the mixing and placement of the photoresist 401. To aid in the mixing and placement of the photoresist 401, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the BARC layer 105.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 401 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene_glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene_glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 401 are merely illustrative and are not intended to limit the embodiments. Rather, any suitable material that may dissolve the photoresist polymer resin and the PACs may alternatively be utilized to help mix and apply the photoresist 401. All such materials are fully intended to be included within the scope of the embodiments.

Additionally, while individual ones of the above described materials may be used as the photoresist solvent for the photoresist 401, in alternative embodiments more than one of the above described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 401. The photoresist cross-linking agent reacts with the photoresist polymer resin within the photoresist 401 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the photoresist solvents, and the photoresist cross-linking agents, the photoresist 401 may also include a number of other additives that will assist the photoresist 401 obtain the highest resolution. For example, the photoresist 401 may also include surfactants in order to help improve the ability of the photoresist 401 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the photoresist 401 is a quencher, which may be utilized to inhibit diffusion of the generated acids/bases/free radicals within the photoresist, which helps the resist pattern configuration as well as to improve the stability of the photoresist 401 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 401 is a stabilizer, which assists in preventing undesired diffusion of the acids generated during exposure of the photoresist 401. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 401 may be a dissolution inhibitor in order to help control dissolution of the photoresist 401 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 401 may be a plasticizer. Plasticizers may be used to reduce delamination and cracking between the photoresist 401 and underlying layers (e.g., the BARC layer 105) and may comprise monomeric, oligomeric, and polymeric plasticizers such as oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 401 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 401 in order to promote adhesion between the photoresist 401 and an underlying layer upon which the photoresist 401 has been applied (e.g., the BARC layer 105). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 401 in order to assist a top surface of the photoresist 401 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin and the PACs, along with any desired additives or other agents, are added to the photoresist solvent for application. Once added, the mixture is then mixed in order to achieve an even composition throughout the photoresist 401 in order to ensure that there are no defects caused by an uneven mixing or non-constant composition of the photoresist 401. Once mixed together, the photoresist 401 may either be stored prior to its usage or else used immediately.

Once ready, the photoresist 401 may be utilized by initially applying the photoresist 401 onto the BARC layer 105. The photoresist 401 may be applied to the BARC layer 105 so that the photoresist 401 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 401 may be applied such that it has a thickness over the surface of the BARC layer 105 of between about 10 nm and about 300 nm, such as about 150 nm.

Once the photoresist 401 has been applied to the semiconductor substrate, a pre-bake of the photoresist 401 is performed in order to cure and dry the photoresist 401 prior to exposure to finish the application of the photoresist 401. The curing and drying of the photoresist 401 removes the photoresist solvent component while leaving behind the photoresist polymer resin, the PACs, photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 401. The pre-bake is performed for a time sufficient to cure and dry the photoresist 401, such as between about 10 seconds to about 5 minutes, such as about 90 seconds.

Once applied, the photoresist 401 may be exposed to form an exposed region 403 and an unexposed region 405 within the photoresist 401. In an embodiment the exposure may be initiated by placing the substrate 101 and the photoresist 401, once cured and dried, into a photoresist imaging device 400 for exposure. The photoresist imaging device 400 may comprise a photoresist support plate 404, a photoresist energy source 407, a patterned mask 409 between the photoresist support plate 404 and the photoresist energy source 407, and photoresist optics 413. In an embodiment the photoresist support plate 404 is a surface to which the semiconductor device 100 and the photoresist 401 may be placed or attached to and which provides support and control to the substrate 101 during exposure of the photoresist 401. Additionally, the photoresist support plate 404 may be movable along one or more axes, as well as providing any desired heating or cooling to the substrate 101 and photoresist 401 in order to prevent temperature gradients from affecting the exposure process.

In an embodiment the photoresist energy source 407 supplies photoresist energy 411 such as light to the photoresist 401 in order to induce a reaction of the PACs, which in turn reacts with the photoresist polymer resin to chemically alter those portions of the photoresist 401 to which the photoresist energy 411 impinges. In an embodiment the photoresist energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 407 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of photoresist energy 411, such as mercury vapor lamps, xenon lamps, carbon arc lamps or the like, may alternatively be utilized.

The patterned mask 409 is located between the photoresist energy source 407 and the photoresist 401 in order to block portions of the photoresist energy 411 to form a patterned energy 415 prior to the photoresist energy 411 actually impinging upon the photoresist 401. In an embodiment the patterned mask 409 may comprise a series of layers (e.g., substrate, absorbance layers, anti-reflective coating layers, shielding layers, etc.) to reflect, absorb, or otherwise block portions of the photoresist energy 411 from reaching those portions of the photoresist 401 which are not desired to be illuminated. The desired pattern may be formed in the patterned mask 409 by forming openings through the patterned mask 409 in the desired shape of illumination.

Optics (represented in FIG. 4A by the trapezoid labeled 413) may be used to concentrate, expand, reflect, or otherwise control the photoresist energy 411 as it leaves the photoresist energy source 407, is patterned by the patterned mask 409, and is directed towards the photoresist 401. In an embodiment the photoresist optics 413 comprise one or more lenses, mirrors, filters, combinations of these, or the like to control the photoresist energy 411 along its path. Additionally, while the photoresist optics 413 are illustrated in FIG. 4A as being between the patterned mask 409 and the photoresist 401, elements of the photoresist optics 413 (e.g., individual lenses, mirrors, etc.) may also be located at any location between the photoresist energy source 407 (where the photoresist energy 411 is generated) and the photoresist 401.

In an embodiment the semiconductor device 100 with the photoresist 401 is placed on the photoresist support plate 404. Once the pattern has been aligned to the semiconductor device 100, the photoresist energy source 407 generates the desired photoresist energy 411 (e.g., light) which passes through the patterned mask 409 and the photoresist optics 413 on its way to the photoresist 401. The patterned energy 415 impinging upon portions of the photoresist 401 induces a reaction of the PACs within the photoresist 401. The chemical reaction products of the PACs' absorption of the patterned energy 415 (e.g., acids/bases/free radicals) then reacts with the photoresist polymer resin, chemically altering the photoresist 401 in those portions that were illuminated through the patterned mask 409.

In a specific example in which the patterned energy 415 is a 193 nm wavelength of light, the PAC is a photoacid generator, and the group to be decomposed is a carboxylic acid group on the hydrocarbon structure and a cross linking agent is used, the patterned energy 415 will impinge upon the photoacid generator and the photoacid generator will absorb the impinging patterned energy 415. This absorption initiates the photoacid generator to generate a proton (e.g., a $H^+$ ion) within the photoresist 401. When the proton impacts the carboxylic acid group on the hydrocarbon structure, the proton will react with the carboxylic acid group, chemically altering the carboxylic acid group and altering the properties of the photoresist polymer resin in general. The carboxylic acid group will then react with the photoresist cross-linking agent to cross-link with other photoresist polymer resins within the photoresist 401.

Optionally, the exposure of the photoresist 401 may occur using an immersion lithography technique. In such a technique an immersion medium (not individually illustrated in FIG. 2) may be placed between the photoresist imaging device 400 (and particularly between a final lens of the photoresist optics 413) and the photoresist 401. With this immersion medium in place, the photoresist 401 may be patterned with the patterned energy 415 passing through the immersion medium.

In this embodiment a protective layer (also not individually illustrated in FIG. 4A) may be formed over the photoresist 401 in order to prevent the immersion medium from coming into direct contact with the photoresist 401 and leaching or otherwise adversely affecting the photoresist 401. In an embodiment the protective layer is insoluble within the immersion medium such that the immersion medium will not dissolve it and is immiscible in the photoresist 401 such that the protective layer will not adversely affect the photoresist 401. Additionally, the protective layer is transparent so that the patterned energy 415 may pass through the protective layer without hindrance.

In an embodiment the protective layer comprises a protective layer resin within a protective layer solvent. The material used for the protective layer solvent is, at least in part, dependent upon the components chosen for the photoresist 401, as the protective layer solvent should not dissolve the materials of the photoresist 401 so as to avoid degradation of the photoresist 401 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 401, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 401, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 401. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 401 of about 100 nm.

After the protective layer composition has been applied to the photoresist 401, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 401, the semiconductor device 100 with the photoresist 401 and the protective layer are placed on the photoresist support plate 404, and the immersion medium may be placed between the protective layer and the photoresist optics 413. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 413 may be done using, e.g., an air knife method, whereby fresh immersion medium is applied to a region between the protective layer and the photoresist optics 413 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 401 may be exposed using an immersion method. Any other suitable method for imaging the photoresist 401 using an immersion medium, such as immersing the entire substrate 101 along with the photoresist 401 and the protective layer, using solid barriers instead of gaseous barriers, or using an immersion medium without a protective layer, may also be utilized. Any suitable method for exposing the photoresist 401 through the immersion medium may be used, and all such methods are fully intended to be included within the scope of the embodiments.

After the photoresist 401 has been exposed to the patterned energy 415, a post-exposure baking may be used in order to assist in the generating, dispersing, and reacting of the acid/base/free radical generated from the impingement of the patterned energy 415 upon the PACs during the exposure. Such assistance helps to create or enhance chemical reactions which generate chemical differences between the exposed region 403 and the unexposed region 405 within the photoresist 401. These chemical differences also caused differences in the solubility between the exposed region 403 and the unexposed region 405. In an embodiment this post-exposure baking may occur at temperatures of between about 50° C. and about 160° C. for a period of between about 40 seconds and about 120 seconds.

FIG. 4B illustrates a development of the photoresist 401 with the use of a developer 417 after the photoresist 401 has been exposed. After the photoresist 401 has been exposed and the post-exposure baking has occurred, the photoresist 401 may be developed using either a positive tone developer or a negative tone developer, depending upon the desired pattern for the photoresist 401. In an embodiment in which the exposed region 403 of the photoresist 401 is desired to be removed to form a positive tone, a positive tone developer such as a basic aqueous solution may be utilized to remove those portions of the photoresist 401 which were exposed to the patterned energy 415 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

If a negative tone development is desired, an organic solvent or critical fluid may be utilized to remove those portions of the photoresist 401 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 401 that has a different property (e.g., solubility) than another portion of the photoresist 401, may alternatively be utilized, and all such developers are fully intended to be included within the scope of the embodiments.

In an embodiment in which immersion lithography is utilized to expose the photoresist 401 and a protective layer is utilized to protect the photoresist 401 from the immersion medium, the developer 417 may be chosen to remove not only those portions of the photoresist 401 that are desired to be removed, but may also be chosen to remove the protective layer in the same development step. Alternatively, the protective layer may be removed in a separate process, such as by a separate solvent from the developer 417 or even an etching process to remove the protective layer from the photoresist 401 prior to development.

FIG. 4B illustrates an application of the developer 417 to the photoresist 401 using, e.g., a spin-on process. In this process the developer 417 is applied to the photoresist 401 from above the photoresist 401 while the semiconductor device 100 (and the photoresist 401) is rotated. In an embodiment the developer 417 may be supplied at a flow rate of between about 300 mL/min and about 1000 mL/min, such as about 500 mL/min, while the semiconductor device 100 is being rotated at a speed of between about 500 rpm and about 2500 rpm, such as about 1500 rpm. In an embodiment the developer 417 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 401 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 4B illustrates a cross-section of the development process in an embodiment in which a negative tone developer is used to remove the unexposed regions of the photoresist 401. As illustrated, the developer 417 is applied to the photoresist 401 and dissolves the unexposed portion 405 of the photoresist 401. This dissolving and removing of the unexposed portion 405 of the photoresist 401 leaves behind an opening within the photoresist 401 that patterns the photoresist 401 in the shape of the patterned energy 415, thereby transferring the pattern of the patterned mask 409 to the photoresist 401.

Once the photoresist 401 has been patterned, the pattern may be transferred to the BARC layer 105. In an embodiment in which the BARC layer 105 remains insoluble to the developer 417, the BARC layer 105 may be removed using an etching process that utilizes the photoresist 401 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

Alternatively, in an embodiment in which the BARC layer 105 comprises an acid labile group that can react to de-crosslink the cross-linked polymers in the BARC layer 105 and change the solubility of the BARC layer 105, the BARC layer 105 may be patterned during the development process by the developer 417. In particular, during exposure the photoacid generators may generate an acid in the BARC layer 105, which will work to break the cross-linking bonds and change the solubility of the BARC layer 105. Then, in a positive tone development process, a positive tone developer may be used to remove both the photoresist 401 that had been exposed as well as to remove the BARC layer 105 in the same process. Any suitable patterning process, with any suitable number of steps, may be utilized to pattern and remove both the photoresist 401 and the BARC layer 105, and all such processes and steps are fully intended to be included within the scope of the embodiments.

Figure 5:
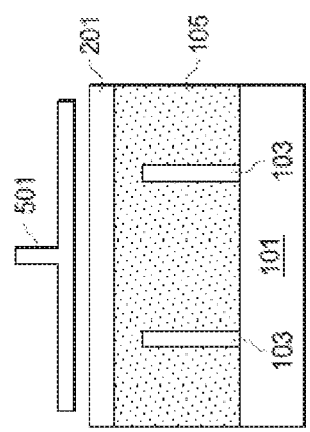
FIG. 5 illustrates another embodiment in which the bottom anti-reflective coating is planarized in a chemical mechanical polishing process in accordance with an embodiment.

FIG. 5 illustrates another embodiment in which the BARC layer 105 is utilized in a physical planarization process such as a chemical mechanical polish (CMP). In a CMP process, a combination of etching materials and abrading materials are put into contact with the BARC layer 105 (or a layer overlying the BARC layer 105, such as the photoresist 401) and a grinding pad 501 is used to grind away the BARC layer 105 (or any layers overlying the BARC layer 105) until a desired thickness is achieved.

In this embodiment the floating region 201 along the top surface of the BARC layer 105 will cause the polymer resin to cros slink within the floating region 201 more than within the remainder of the BARC layer 105. As such, the remainder of the BARC layer 105 (that portion outside of the floating region 201) will have a lower cross-linking density and will remain more flexible than the floating region 201. This flexibility can better withstand the shear forces that are associated with the physical grinding of the chemical mechanical polishing process without a failure such as peeling occurring.

Figure 6:
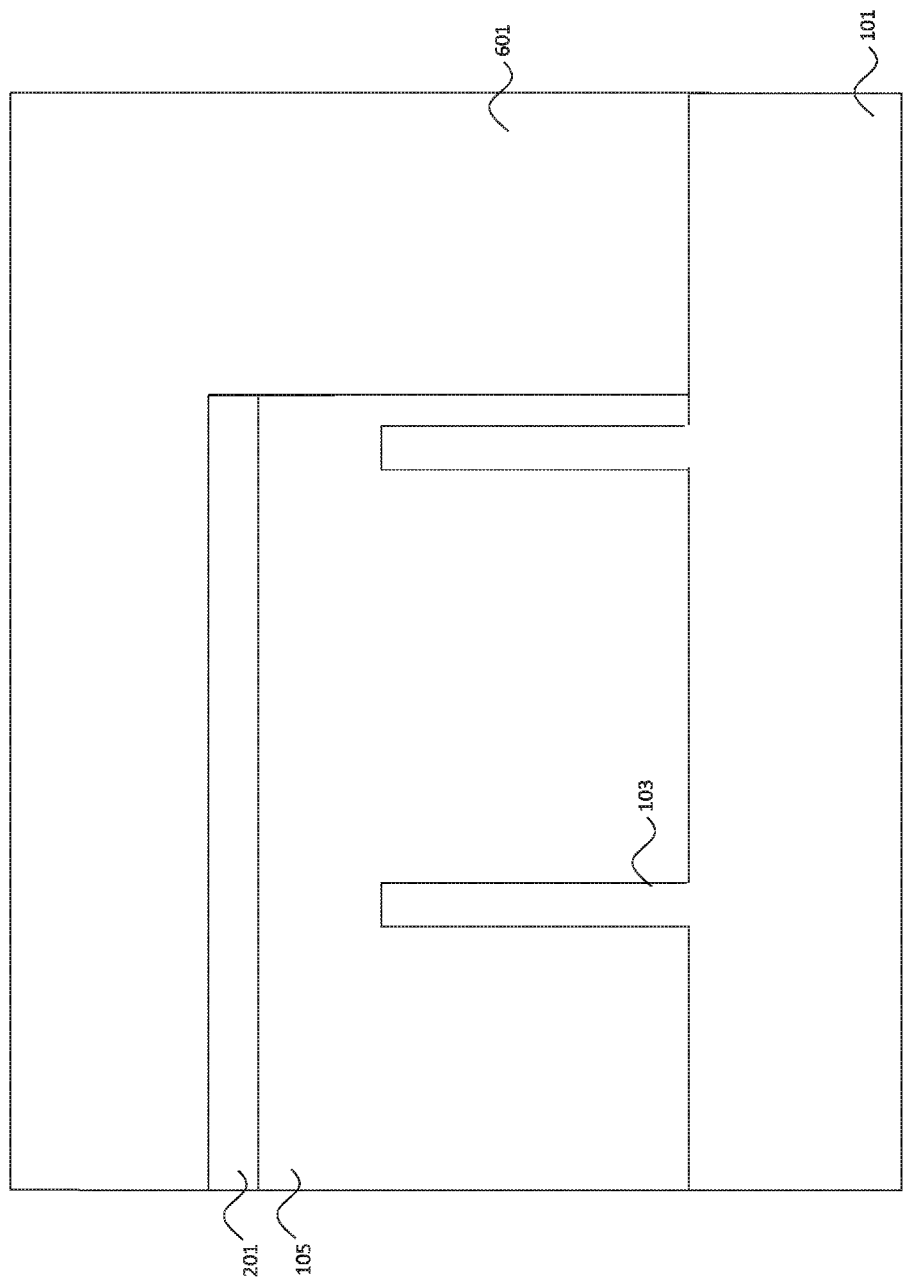
FIG. 6 illustrates a step in the removal of the bottom anti-reflective layer and the floating region in accordance with an embodiment.

FIG. 6 illustrates a removal of the photoresist 401 and the BARC layer 105, with the floating region 201. In an embodiment the photoresist 401 may be removed using, e.g., an ashing process, whereby the temperature of the photoresist 401 is increased until the photoresist 401 undergoes a thermal decomposition. Once thermally decomposed, the photoresist 401 may be physically removed using one or more wash processes.

Once the photoresist 401 has been removed, the BARC layer 105 (with the floating region 201) may be removed using a fluid 601 that will interact with the BARC layer 105 to remove both the floating region 201 as well as the remainder of the BARC layer 105. In an embodiment, the fluid 601 is a fluid that will interact either physically, chemically, or through columbic forces in order to effectuate a removal of the BARC layer 105. In a particular embodiment the fluid 601 may comprise an aqueous solution. When the fluid is an aqueous solution, the aqueous solution may be either acidic (e.g., with a pH of between about −1 to 4) or basic (with a pH of between about 9 to 14). The pH in these embodiments may be adjusted as desired using either organic or inorganic acids or bases (as described further below).

Alternatively, a wet cleaning process may be used to remove the BARC layer 105. In an embodiment in which a wet clean process is utilized, a solution such as an SC-1 or SC-2 cleaning solution may be utilized, although other solutions, such as a mixture of $H_2SO_4$ and $H_2O_2$ (known as SPM), or a solution of hydrogen fluoride (HF), may alternatively be utilized. Any suitable solution or process that may be used to remove the BARC layer 105 are fully intended to be included within the scope of the embodiments.

Alternatively, the fluid 601 may be an organic solvent. In this embodiment the fluid 601 may be an ester, an ether, an amide, an alcohol, an anhydride, or an alkane, with between 2 and 30 carbon atoms. However, any other suitable organic solvent, such as the BARC solvent or photoresist solvent, discussed above, may alternatively be utilized.

The fluid 601 may be applied to the BARC layer 105 using, e.g., a wet etch process. In an embodiment the BARC layer 105 and the floating region 201 are immersed in the fluid 601 using, e.g., a dip process, a puddle process, a spray-on process, combinations of these, or the like. The fluid 601 may have a temperature of between about 30° C. and about 150° C., such as about 50° C.

However, because the floating region 201 has a greater amount of cross-linking within it than the remainder of the BARC layer 105, the floating region 201 also has a greater density than the remainder of the BARC layer 105. As such, the floating region 201 will also have a different rate of removal from the fluid 601 than the remainder of the BARC layer 105. In a particular embodiment the floating region 201 will have a lower rate of removal than the remainder of the BARC layer 105.

Given that the remainder of the BARC layer 105 has a faster removal rate than the floating region 201, the BARC layer 105 (including the floating region 201) can be removed at a much faster rate than other BARC layers that may not have the floating region 201. These other BARC layers (without the floating region 201) may have a constant cross-linking and constant density, which may not see any removal until at least 10 minutes after immersion. As such, in an embodiment in which the BARC layer 105 and the floating region 201 are immersed in the fluid 601, the immersion may be performed for a time of less than about 1 minute.

In an embodiment in which the fluid 601 uses chemical reactions to remove the BARC layer 105 and the floating region 201, the fluid 601 may react with the BARC layer 105 in a number of methods in order to effectuate the removal. For example, the chemical reaction may be an oxidation/ reduction reaction, an acid/base reaction, a substitution reaction, an addition reaction, combinations, of these, or the like. For example, the fluid 601 may comprise an inorganic acid (e.g., sulfonic acid, hydrochloric acid, sulfuric acid), an organic acid (e.g., acetic acid), an inorganic base (e.g., sodium hydroxide or potassium hydroxide), or an organic base (e.g., triethylamine, pyridine, methylamine, tetramethylammonium hydroxide, tetrabutylammonium hydroxide, choline guanidine, imidazole, Organolithiums or Grignard reagent) in order to react with the BARC layer 105. Any suitable type of chemical reaction may be utilized in order to remove the BARC layer 105 and the floating region 201.

Alternatively, in an embodiment in which the removal process uses the fluid 601 to use physical forces to remove the BARC layer 105 and the floating region 201, the physical forces could be columbic forces, whereby the fluid 601 is utilized to modify the surface energy of the BARC layer 105. By modifying the surface energy, the adhesion between the BARC layer 105 and the underlying layers (e.g., the substrate and the fins 103) may be reduced or eliminated, thereby at least partially releasing the BARC layer 105 from its adhesion with the underlying layers and allowing the BARC layer 105 to be removed from the underlying layers.

The fluid 601 may further comprise additives that either assist in the physical properties of the fluid 601 or else assist in the chemical reactions between the fluid 601 and the BARC layer 105. In an embodiment the fluid 601 may additionally include a surfactant. In an embodiment the surfactant may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Additionally, the fluid 601 may also comprise additional components that may help stabilize or control the physical properties of the fluid 601. For example, the fluid 601 may comprise a component such as ozone, which may be used to stabilize the fluid 601 as well as act as a surfactant, hydrogen peroxide, and/or carbon dioxide, which may be useful in modifying a surface charge. Any suitable materials may be included within the fluid 601 in order to help control the fluid 601, and all such materials are fully intended to be included within the scope of the embodiments.

In particular embodiments, the fluid 601 may be a solution within a Standard Clean 1 (SC-1) cleaning process or a sulfuric peroxide mixture (SPM). For example, in the embodiment in which the fluid 601 is an SC-1 fluid, the fluid 601 may be a solution of ammonium hydroxide ($NH_4OH$), hydrogen peroxide ($H_2O_2$), and water in a suitable ratio (such as a 1:1:5 ratio). Such a solution will remove both the floating region 201 as well as the remainder of the BARC layer 105.

By utilizing the fluid 601 such that it will remove the BARC layer 105 with the floating region 201, the overall removal time of the BARC layer 105 may be reduced relative to a BARC layer without the floating region 201. For example, without the floating region 201, wherein the entire BARC layer may have a constant density and a constant cross-linking, the removal may be much more difficult and time consuming, sometimes taking well over 10 minutes to ensure an effective removal of the BARC layer. However, by incorporating the floating region 201, the removal of the overall BARC layer 105 (which has differing regions of density), may be effectuated at a much greater pace, such that an effective removal of the BARC layer 105 may be performed with much less time, such as less than about 1 minute.

Additionally, as one of ordinary skill in the art will recognize, the embodiments described above which utilize the BARC layer 105 to fill voids between the fins 103 over the substrate 101 are merely intended to be illustrative and are not intended to be limiting to the embodiments. Rather, any suitable type of substrate 101 with any suitable type of structures on the substrate 101 may alternatively be utilized. For example, in an embodiment in which the substrate 101 is conductive, the substrate 101 may be formed of a conductive material using processes similar to the processes used for the metallization layers (e.g., damascene, dual damascene, deposition, etc.). In a particular embodiment in which the substrate 101 is conductive, the conductive material for the substrate 101 comprises at least one metal, metal alloy, metal nitride, metal sulfide, metal selenide, metal oxide, or metal silicide. For example, the conductive material can have the formula $MX^3_a$, where M is a metal and $X^3$ is nitrogen, silicon, selenium, or oxygen and wherein a is between 0.4 and 2.5. Particular examples include copper, titanium, aluminum, cobalt, ruthenium, titanium nitride, tungsten nitride ($WN_2$), and tantalum nitride, although any suitable material may alternatively be utilized.

In yet another embodiment the substrate 101 is a dielectric layer with a dielectric constant between about 1 to about 40. In this embodiment the substrate 101 comprises silicon, a metal oxide, or a metal nitride with a formula of $MX^4_b$, where M is a metal or silicon, $X^4$ is nitrogen or oxygen, and b is between about 0.4 and 2.5. In particular examples the dielectric layer for the substrate 101 may be silicon oxide, silicon nitride, aluminum oxide, hafnium oxide, lanthanum oxide, or the like, formed using such processes as deposition, oxidation, or the like.

FIG. 7 illustrates a removal of the fluid 601 after the BARC layer 105 (including the floating region 201) has been removed. As can be seen, the removal of the fluid 601 and the BARC layer 105 leaves behind the substrate 101 and the fins 103. Once the BARC layer 105 has been removed, additional processing may be performed on the fins 103, such as by forming multiple-gate transistors from the fins 103.

FIG. 8 illustrates another embodiment in which the BARC layer 105 (with the floating region 201) is utilized along with a middle layer 801 that is placed on the BARC layer 105 after the floating region 201 has been formed. In an embodiment the middle layer 801 may be an organic layer or inorganic layer that has a different etch resistance than the photoresist 401. In one embodiment the middle layer 801 comprises at least one etching resistance molecule such as a low onishi number structure, a double bond structure, a triple bond structure, titanium, titanium nitride, aluminum, aluminum oxide, silicon oxynitride, or the like.

In another particular embodiment the middle layer 801 is a hard mask material such as silicon, silicon nitride, oxides, oxynitrides, silicon carbide, combinations of these, or the like. The hard mask material for the middle layer 801 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 801 may be formed to a thickness of between about 100 Å and about 800 Å, such as about 300 Å.

Once a layer of the hard mask material for the middle layer 801 has been formed, the photoresist 401 may be placed and patterned over the hard mask material for the middle layer 801. The placement of the photoresist 401 over the hard mask material for the middle layer 801 and the patterning of the photoresist 401 may be similar to the placement of the photoresist 401 and the development of the photoresist 401 as described above with respect to FIGS. 1-4B. For example, the photoresist 401 may be placed using a spin-on process, illuminated using the photoresist imaging device 400, and then developed using the developer 417.

FIG. 8 also illustrates that, once the photoresist 401 has been patterned into the desired pattern, the photoresist 401 may be used as a mask to pattern the hard mask material of the middle layer 801. For example, the pattern of the photoresist 401 may be transferred to the middle layer 801 using an anisotropic etching process such as reactive ion etching (RIE), whereby ions of a suitable etchant such as $CF_4/O_2$, may be utilized in a dry etch to remove portions of the middle layer 801 exposed by the patterned photoresist 401. However, any other suitable etchant, such as $CHF_3/O_2$, $CH_2F_2$, $CH_3F$, or the like, and any other suitable method of removal, such as a wet stripping, may alternatively be used.

FIG. 8 further illustrates that once the pattern of the photoresist 401 has been transferred to the middle layer 801, the middle layer 801 may be used to transfer the pattern of the photoresist 401 to the BARC layer 105. In an embodiment the BARC layer 105 may be removed using an etching process that utilizes the photoresist 401 and the middle layer 801 (now patterned) as masking layers. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously as the middle layer 801, and any other suitable etchants may alternatively be used.

However, as one of ordinary skill will recognize, the placement of the middle layer 801 over the BARC layer 105 is intended to be illustrative and is not intended to be limiting to the embodiments. Rather, the middle layer 801 may be placed in any relation to the BARC layer 105, such as by being between the BARC layer 105 and the substrate 101. Any suitable sequence of layers is fully intended to be included within the scope of the embodiments.

By utilizing the BARC layer 105 along with the floating region 201 and the middle layer 801, the pattern from the photoresist 401 can be formed within the middle layer 801 and the BARC layer 105. This pattern may then be used for additional processing of the substrate 101 and the fins 103.

FIG. 9 illustrates a process flow which may be utilized to apply and remove the BARC layer 105 with the floating region 201. In an embodiment the BARC layer 105 is dispense or applied in a first step 901. Once dispensed, the floating region 201 is formed within the BARC layer 105 in a second step 903. Once utilized, the BARC layer 105 and the floating region 201 are removed by applying a fluid to the BARC layer 105 and the floating region 201 in a third step 905.

In accordance with an embodiment, a method for manufacturing a semiconductor device comprising dispensing an anti-reflective material over a substrate to form an anti-reflective coating layer, the anti-reflective material having a first concentration of a floating component is provided. A floating region is formed adjacent to a top surface of the anti-reflective layer, the floating region having a second concentration of the floating component greater than the first concentration.

In accordance with another embodiment, a method of manufacturing a semiconductor device comprising applying an anti-reflective coating onto a substrate, the anti-reflective coating comprising at least one component that has a fluorine atom, is provided. A floating region is formed along a top surface of the anti-reflective coating, wherein the floating region has a higher concentration of the at least one component than the remainder of the anti-reflective coating. The anti-reflective coating is baked to initiate a cross-linking reaction in the floating region.

In accordance with yet another embodiment, an anti-reflective material comprising a polymer resin and a cross-linking agent is provided, wherein one of the polymer resin or the cross-linking agent comprises a fluorine atom. The anti-reflective material also comprises a catalyst.

In accordance with yet another embodiment, a method of manufacturing a semiconductor device comprising dispensing an anti-reflective material over a substrate to form an anti-reflective coating layer, the anti-reflective material having a first concentration of a floating component, is provided. A floating region is formed adjacent to a top surface of the anti-reflective coating, the floating region having a second concentration of the floating component greater than the first concentration. A fluid is applied to the anti-reflective material to remove the anti-reflective material and the floating region.

In accordance with yet another embodiment, a method of manufacturing a semiconductor device comprising applying an anti-reflective coating onto a substrate and forming from the anti-reflective coating a first region with a first rate of removal along a top surface of the anti-reflective coating, wherein a second region of the anti-reflective coating has a second rate of removal different from the first rate of removal, is provided. The first region and the second region are removed by applying a fluid to the anti-reflective coating.

In accordance with yet another embodiment, a method of manufacturing a semiconductor device comprising applying an anti-reflective coating onto a substrate, the anti-reflective coating comprising at least one component that has a fluorine atom, is provided. A floating region is formed along a top surface of the anti-reflective coating, wherein the floating region has a higher concentration of the at least one component than a remainder of the anti-reflective coating, and the floating region and the remainder of the anti-reflective coating are removed by applying a fluid to the anti-reflective coating for less than one minute.

Although the present embodiments and their advantages have been described in detail, it should be understood that various changes, substitutions and alterations can be made herein without departing from the spirit and scope of the disclosure as defined by the appended claims. For example, many different monomers may be used to form the material of the BARC layer, and may different processes may be utilized to form, apply, and develop the photoresist.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
dispensing an anti-reflective material between a first fin and a second fin of a substrate to form an anti-reflective coating, the anti-reflective material having a first concentration of a floating component;
forming a floating region adjacent to a top surface of the anti-reflective coating and over the first fin and the second fin, the floating region being at least 10 Å thick and having a second concentration of the floating component greater than the first concentration, wherein after the forming the floating region a second component has a constant concentration throughout the anti-reflective coating;
forming a middle layer over the floating region; and
applying a fluid to the anti-reflective coating to chemically react with and remove the anti-reflective material and the floating region.

2. The method of claim 1, wherein the fluid is an inorganic acid.

3. The method of claim 1, wherein the fluid is an organic acid.

4. The method of claim 1, wherein the fluid is an inorganic base.

5. The method of claim 1, wherein the fluid is an organic base.

6. The method of claim 1, wherein the forming the middle layer comprises forming a hard mask material.

7. The method of claim 1, wherein the forming the middle layer comprises forming the middle layer with a thickness of between about 100 Å and about 800 Å.

8. A method of manufacturing a semiconductor device, the method comprising:
applying an anti-reflective coating onto a substrate, the anti-reflective coating comprising a first solvent;
forming a floating region within the anti-reflective coating with a first thickness of at least 10 Å along a top surface of the anti-reflective coating, wherein the floating region has a slower rate of removal than a remainder of the anti-reflective coating and wherein the anti-reflective coating has at least one component with a constant concentration throughout the anti-reflective coating;
depositing a middle layer over the floating region;
patterning the anti-reflective coating while the middle layer is over the floating region; and
after the patterning the anti-reflective coating, simultaneously removing the floating region and the remainder of the anti-reflective coating by applying a fluid to the anti-reflective coating to remove the floating region and the remainder of the anti-reflective coating.

9. The method of claim 8, wherein the applying the fluid comprises applying an organic solvent.

10. The method of claim 9, wherein the organic solvent is the first solvent.

11. The method of claim 8, wherein the fluid comprises a surfactant.

12. The method of claim 8, wherein the fluid comprises ozone.

13. The method of claim 8, wherein the fluid comprises carbon dioxide.

14. The method of claim 8, wherein the depositing the middle layer deposits silicon nitride.

15. A method of manufacturing a semiconductor device, the method comprising:
forming semiconductor fins over a substrate;
applying a bottom anti-reflective coating onto the substrate and between the semiconductor fins, wherein during the applying the bottom anti-reflective coating a first component has a constant first concentration throughout the bottom anti-reflective coating;
forming a first region and a second region within the bottom anti-reflective coating, wherein the first region has a thickness of at least 10 Å and comprises a second concentration of the first component higher than the first concentration and wherein a second component has a third concentration which is constant throughout the bottom anti-reflective coating;
depositing a hard mask layer over the first region; and
applying a fluid to the bottom anti-reflective coating in order to remove the bottom anti-reflective coating.

16. The method of claim 15, further comprising:
applying a photoresist over the hard mask layer;
exposing the photoresist to a patterned energy source;
developing the photoresist after the exposing the photoresist to form a patterned photoresist; and
etching the hard mask layer using the patterned photoresist as a mask.

17. The method of claim 16, wherein at a time of the applying the photoresist the photoresist comprises a photoresist solvent material and wherein the fluid is the photoresist solvent material.

18. The method of claim 15, wherein the fluid comprises an SC-1 fluid.

19. The method of claim 15, wherein the fluid comprises an organic solvent.

20. The method of claim 15, further comprising forming a multiple-gate transistor with the semiconductor fins.

* * * * *